United States Patent
Hsieh et al.

(10) Patent No.: US 6,351,375 B1
(45) Date of Patent: *Feb. 26, 2002

(54) DUAL-PURPOSE BACKPLANE DESIGN FOR MULTIPLE TYPES OF HARD DISKS

(75) Inventors: Jenwei Hsieh, Austin; Truc Nguyen, Round Rock, both of TX (US)

(73) Assignee: Dell USA, L.P., Round Rock, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/237,745

(22) Filed: Jan. 26, 1999

(51) Int. Cl.[7] .............................. G06F 1/16; H05K 7/10
(52) U.S. Cl. ....................................... 361/685; 361/727
(58) Field of Search ................................ 361/679, 683, 361/684, 685, 738, 1, 731; 439/680, 674, 677

(56) References Cited

U.S. PATENT DOCUMENTS

| | | | |
|---|---|---|---|
| 5,398,158 A | * 3/1995 | Fisher et al. ................. | 361/685 |
| 5,404,268 A | 4/1995 | O'Connor | |
| 5,492,481 A | 2/1996 | Lewis | |
| 5,495,584 A | 2/1996 | Holman, Jr. et al. | |
| 5,517,623 A | 5/1996 | Farrell et al. | |
| 5,544,330 A | 8/1996 | Bither et al. | |
| 5,623,700 A | 4/1997 | Parks et al. | |
| 5,640,606 A | * 6/1997 | Glenn, Jr. et al. ........... | 395/882 |
| 5,652,697 A | * 7/1997 | Le ............................... | 361/788 |
| 5,726,922 A | 3/1998 | Womble et al. | |
| 5,740,378 A | 4/1998 | Rehl et al. | |
| 5,793,998 A | 8/1998 | Copeland et al. | |
| 5,911,050 A | * 6/1999 | Egan et al. .................. | 395/280 |
| 6,018,456 A | * 1/2000 | Young et al. ................ | 361/684 |
| 6,058,442 A | * 5/2000 | Fort ............................. | 710/100 |
| 6,146,150 A | * 11/2000 | Roberts ........................ | 439/55 |

* cited by examiner

*Primary Examiner*—Lynn D. Feild
(74) *Attorney, Agent, or Firm*—Haynes and Boone, L.L.P.

(57) ABSTRACT

Method and apparatus is described herein for accommodating two types of hard disks, for example, SCSI disks and FC-AL disks, using a single, dual-purpose backplane. The dual-purpose backplane includes a plurality of drive bays each including a first connector for receiving a complementary connector of an SCSI disk and a second connector for receiving a complementary connector of an FC-AL disk. In a computer system, one or the other of the first and second connectors is mounted upside down to avoid overlapping and structural interference with connection of other hard disks to the backplane. In an external storage system, hard disks are inserted sideways, and thus one connector type is mounted on the backplane in an orientation rotated 180 degrees from the other connector type.

11 Claims, 2 Drawing Sheets

DUAL-PURPOSE BACKPLANE DESIGN FOR MULTIPLE TYPES OF HARD DISKS

BACKGROUND

This disclosure relates generally to computer systems, and more particularly to a backplane that accommodates multiple types of hard disks.

Computer systems use buses for executing data transfers between a host computer system and subsystems or peripheral devices. Alternatively, buses can be used for executing data transfers among the subsystems or devices. A backplane is often used to route the buses. At given locations on the back plane, electrical bus connectors are mounted atop the bus paths. Components can be mated with the connectors, such that data can be communicated via the bus to the connected components. For example, small computer systems interface ("SCSI") subsystems can be designed around such a hardwired backplane to route the buses to the subsystems or devices. Similarly, a backplane disposed in an external storage system allows hard disks inside the subsystem to be used by the computer system.

For illustrative purposes two common types of hard disks, are examined including SCSI disks and Fiber Channel-Arbitrated Loop ("FC-AL") disks, however, this embodiment comprises using any two kinds of hard disks. Both disk types serve to store and transfer data; however, FC-AL disks have higher data transfer rates and use a serial, rather than a parallel, interface, which requires less components and results in a simpler circuit layout for designers.

Smaller chassis designs for either a computer or an external storage system requires more efficient use of space. However, making systems adaptable for future customization and upgrade is also desirable. Traditional backplanes are designed for use with only one type of hard disk. For example, a computer system using an SCSI system, incorporating an FC-AL disk into the system would require also procuring an additional external storage enclosure.

Therefore, what is needed is an apparatus for accommodating multiple types of hard disks, such as SCSI and FC-AL, in a computer or external storage system, in a manner that maximizes use of space, adapts for different combinations of disks, and simplifies manufacture.

SUMMARY

Accordingly, one embodiment disclosed herein is a method and apparatus for accommodating two types of hard disks, for example, SCSI disks and FC-AL disks, using a single, dual-purpose backplane. The dual-purpose backplane includes a plurality of drive bays each including a first connector for receiving a complementary connector of an SCSI disk and a second connector for receiving a complementary connector of an FC-AL disk. In a computer system, one or the other of the first and second connectors is mounted upside down to avoid overlapping and structural interference with connection of other hard disks to the backplane. In an external storage system, hard disks are inserted sideways, and thus one connector type is mounted on the backplane in an orientation rotated 180 degrees from the other connector type.

A technical advantage achieved with the embodiment described herein is that two types of hard disks can be accommodated on the same backplane, thus saving space and adding versatility.

Another advantage achieved with the embodiment described herein is that it uses the same type of disk carrier for both types of disks.

Yet another advantage achieved with the embodiment described herein is that a consumer could use different numbers and combinations of SCSI and FC-AL disks on the same backplane.

DESCRIPTION OF A PREFERRED EMBODIMENT

Figure 1:
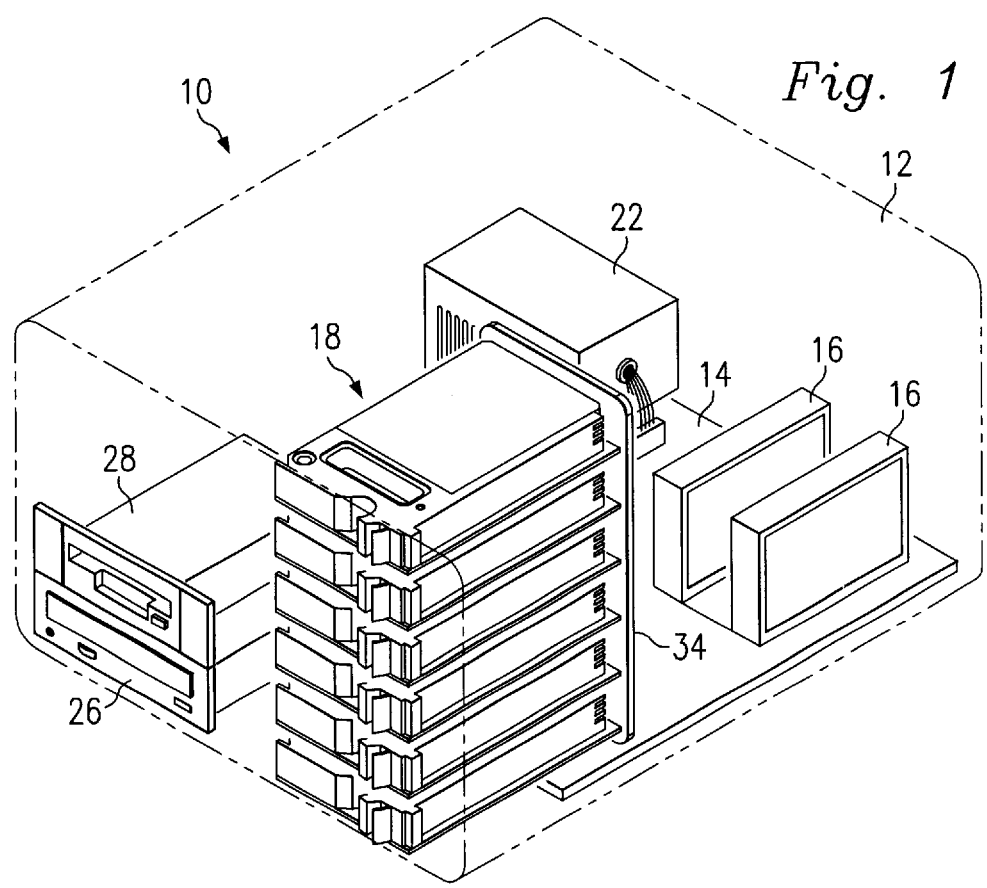
FIG. 1 is a schematic of the interior of a chassis of a computer system having a backplane according to one embodiment.

FIG. 1 depicts a computer, designated generally by a reference numeral 10, which may be, for example, a server, a desktop, or a tower computer. The computer 10 includes a chassis 12 in which a motherboard 14 is mounted. A processor 16, a memory device of modules or hard disks 18, and one or more input/output (I/O) devices (not shown) are mounted on the motherboard 14. Standard buses (not shown) and a backplane 34 are also provided on the motherboard 14 and connect the processor 16 to the memory modules 18 and to the input/output devices. A power supply 22 is connected to the motherboard 14, and a pair of cable assemblies (not shown) connect the motherboard to a hard disk drive unit 26 and a floppy disk drive unit 28, respectively. It is understood that other components, electrical traces, electrical circuits and related devices (not shown) are provided in the chassis 12. Because these are all conventional components, they will not be described in any further detail.

Figure 2:
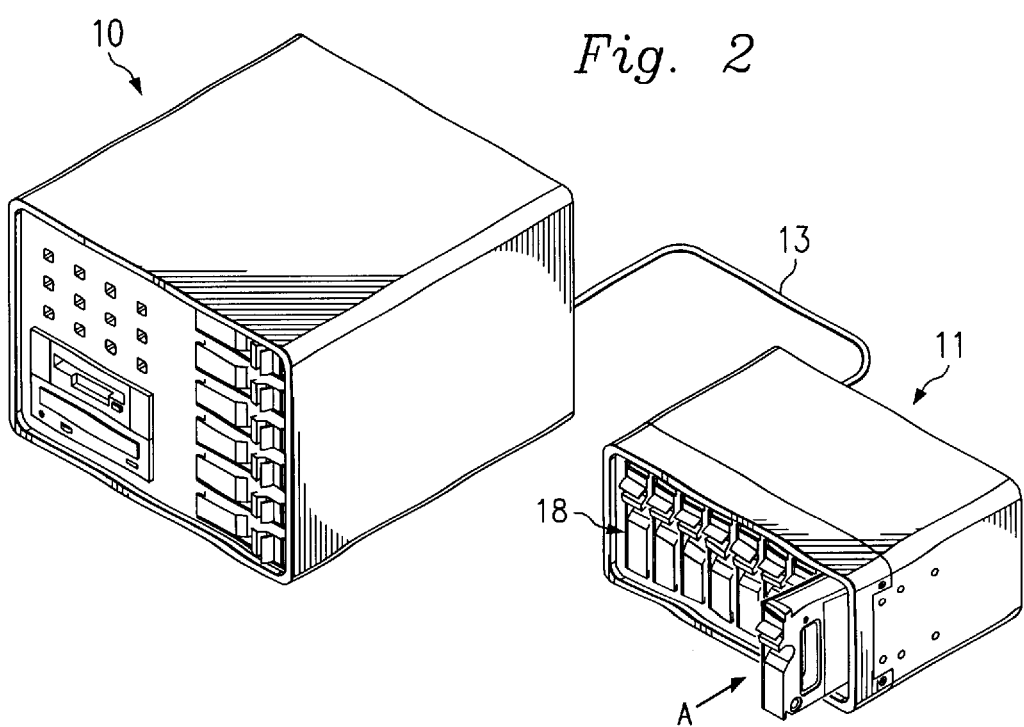
FIG. 2 is an external storage system attached to the computer system.

FIG. 2 depicts an external storage system 11 attached by a cable 13 to the computer 10 of FIG. 1. The external storage system 11 holds a predetermined number of hard disks 18, inserted sideways in a direction shown by arrow A. A backplane (not shown) is disposed inside the external storage system 11 for operatively connecting the hard disks 18 to the computer 10. One hard disk type is mounted on the backplane in an orientation rotated 180 degrees from the other hard disk type, for reasons to be described.

Figure 3:
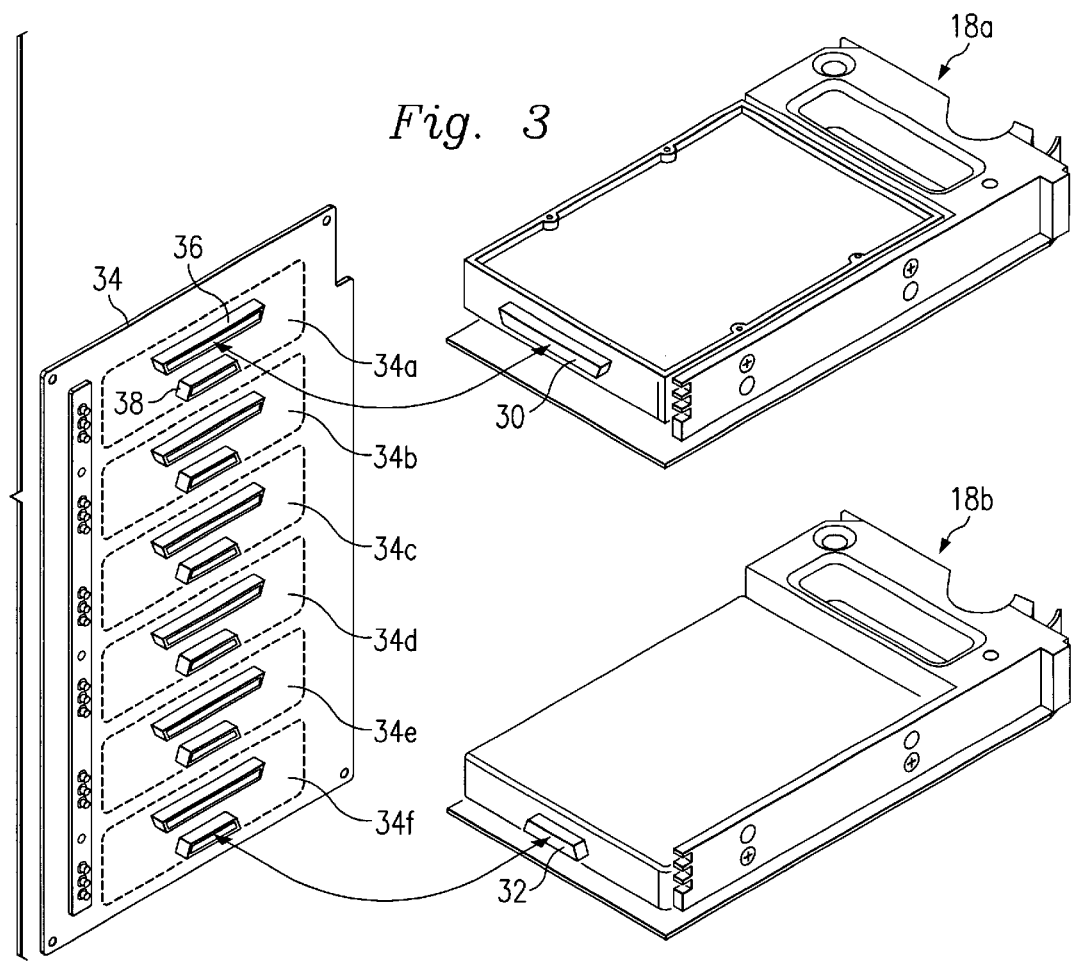
FIG. 3 illustrates the connection of two types of hard disks to the backplane of FIG. 1.

FIG. 3 illustrates connection of two conventional hard disks disposed in disk carriers, in this case, a SCSI disk 18a and an FC-AL disk 18b, to the backplane 34. The backplane is made of any conventional material, and has a plurality of bays 34a–34f, each of which includes an SCSI female connector 36 and an FC-AL female connector 38. The SCSI female connectors 36 are conventional, and wired to couple with an SCSI disk male connector 30 to make an electrical connection therebetween. The FC-AL female connectors 38 are also conventional and wired to couple with an FC-AL male connector 32 to make an electrical connection therebetween. For purposes of illustration, the FC-AL female connectors 38 are shown mounted to the backplane 34 in an upside down orientation relative to the SCSI female connectors 36, thus requiring the FC-AL disk 18b to be mounted to the backplane in an upside down orientation. It will be recognized that the SCSI female connectors 36 could be mounted upside down instead. In any event, one of the connector and disk types must be mounted upside down to avoid structural interference with the connection by the other type female connector and to avoid the disk overlapping into the next bay.

Figure 4:
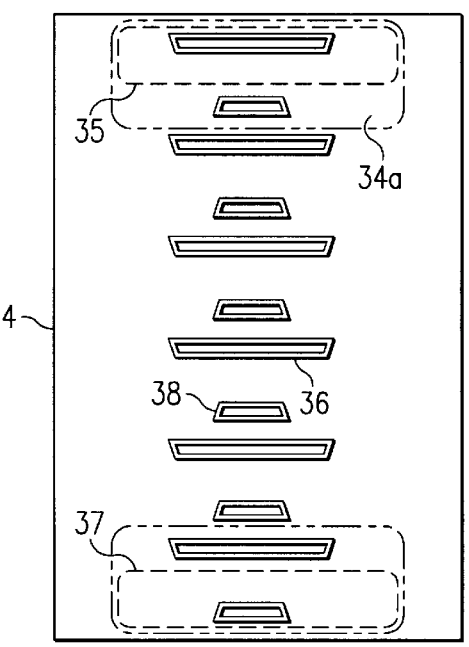
FIG. 4 is a frontal view of the backplane of FIG. 1.

FIG. 4 is a frontal view of the backplane 34, showing the SCSI female connectors 36 and FC-AL female connectors 38. As noted, two connectors comprise a bay, represented by bay 34a. When attached, the SCSI hard disk will occupy a space 35. Likewise, as shown in bay 34f, the FC-AL hard disk will occupy a space 37 when attached. These spaces would overlap, demonstrating that only one hard disk can occupy a bay at any given time.

As can be seen, the principal advantage of this embodiment is that two types of hard disks can be accommodated on the same backplane, thus saving space and adding to the versatility of the computer.

This disclosure shows and describes illustrative embodiments, however, the disclosure contemplates a wide range of modifications, changes and substitutions. Such variations may employ only some features of the embodiments without departing from the scope of the underlying embodiment. Accordingly, any appropriate construction of the appended claims will reflect the broad scope of the underlying embodiment.

What is claimed is:

1. A computer and computer external storage system comprising:
   a chassis;
   a backplane disposed in the chassis;
   first and second adjacent connectors disposed on a surface of the backplane, wherein the first and second backplane connectors are different from one another and the first backplane connector is aligned in a inverted orientation to the second backplane connector;
   a first component disposed in the chassis including a first component connector which only mates with the first backplane connector; and
   a second component disposed in the chassis in an inverted orientation to the first component including a second component connector, different from the first component connector, and which only mates with the second backplane connector.

2. The computer system of claim 1 wherein the first and second backplane connectors are provided in a single bay of the backplane, the bay being configured such that only one of the first and second components may be connected to the bay at a single time.

3. The computer system of claim 2 wherein the backplane contains a plurality of bays.

4. A backplane for receiving different components comprising:
   at least one bay disposed on a surface of the backplane;
   the bay including first and second adjacent backplane connectors, wherein the first and second backplane connectors are different from one another and are aligned such that one of the first and second backplane connectors must be connected to the bay in an orientation rotated 180 degrees from the other connector;
   a first component mounted on the backplane and including a first component connector which only mates with the first backplane connector; and
   a second component mounted on the backplane in an inverted orientation to the first component and including a second component connector, different from the first component connector, and which only mates with the second backplane connector.

5. The backplane of claim 4 wherein the first backplane connector is adapted to mate with a first hard disk comprising a housing and a hard disk connector extending from a surface of the housing thereof, and the second backplane connector is adapted to mate with a second hard disk comprising a housing and a hard disk connector extending from a surface of the housing thereof, whereupon only one of the first and second hard disks may be connected to the bay at a single time.

6. The backplane of claim 5 wherein the backplane has a plurality of bays, and thus the backplane can accommodate the first hard disk and the second hard disk simultaneously.

7. A method of connecting two types of hard disks within a computer chassis or external system chassis using a single backplane, the method comprising:
   mounting the backplane within the chassis;
   providing a surface of the backplane with first and second adjacent backplane connectors, wherein the first and second backplane connectors are different from one another and are oriented on the backplane such that one of the first and second backplane connectors is inverted with respect to the other one of the connectors;
   mounting a first hard disk component on the backplane including a first component connector which only mates with the first backplane connector; and
   mounting a second hard disk component on the backplane in an inverted orientation to the first hard disk component including a second component connector, different from the first component connector, and which only mates with the second backplane connector.

8. The method of claim 7 wherein the aligning comprises:
   determining whether the hard disk is a first type of hard disk or a second type of hard disk, and
   if the hard disk is a first type of hard disk, orienting the hard disk in a first orientation, and
   if the hard disk is a second type of hard disk, orienting the hard disk 180 degrees relative to the first orientation.

9. The method of claim 7 further comprising providing the backplane with several bays, each of the bays including one each of the first and second backplane connectors.

10. The method of claim 9 wherein each bay is configured such that only one of the first and second types of hard disks can be connected to the bay at a given time.

11. The method of claim 9 further comprising connecting a first type of hard disk to the backplane using one of the bays and connecting a second type of hard disk to the backplane using another one of the bays, such that both the first and second types of hard disks are simultaneously connected to the backplane.

* * * * *